United States Patent
Crotty

Patent Number: 6,160,431
Date of Patent: Dec. 12, 2000

[54] POWER-ON RESET CIRCUIT FOR DUAL SUPPLY VOLTAGES

[75] Inventor: Patrick J. Crotty, San Jose, Calif.

[73] Assignee: Xilinx, Inc., San Jose, Calif.

[21] Appl. No.: 09/547,576

[22] Filed: Apr. 12, 2000

Related U.S. Application Data

[62] Division of application No. 09/003,474, Jan. 6, 1998, Pat. No. 6,078,201.

[51] Int. Cl.[7] ..................................................... H03L 7/00
[52] U.S. Cl. ............................................. 327/143; 327/333
[58] Field of Search ................................. 326/22, 26, 62, 326/63, 68, 80, 81; 327/142, 143, 198, 319, 333

[56] References Cited

U.S. PATENT DOCUMENTS

| | | | |
|---|---|---|---|
| 4,970,408 | 11/1990 | Hanke et al. | 307/272.3 |
| 5,214,316 | 5/1993 | Nagai | 307/272.3 |
| 5,313,112 | 5/1994 | Macks | 307/296.3 |
| 5,357,458 | 10/1994 | Yu et al. | 365/49 |
| 5,369,310 | 11/1994 | Badyal et al. | 327/143 |
| 5,394,104 | 2/1995 | Lee | 327/143 |
| 5,440,178 | 8/1995 | McClure | 327/34 |
| 5,446,404 | 8/1995 | Badyal et al. | 327/143 |
| 5,498,987 | 3/1996 | Nelson | 327/143 |
| 5,519,347 | 5/1996 | Kim | 327/143 |
| 5,525,926 | 6/1996 | Merritt | 327/535 |
| 5,610,544 | 3/1997 | Aoki | 327/198 |
| 5,617,048 | 4/1997 | Ward et al. | 327/143 |
| 5,717,354 | 2/1998 | Kim et al. | 327/309 |
| 5,767,710 | 6/1998 | Cho | 327/132 |
| 5,886,549 | 3/1999 | Naura | 327/143 |
| 5,907,257 | 5/1999 | Liu et al. | 307/535 |
| 5,936,443 | 8/1999 | Yasuda et al. | 327/143 |
| 5,952,847 | 9/1999 | Plants et al. | 326/80 |

*Primary Examiner*—Jeffrey Zweizig
*Attorney, Agent, or Firm*—Edel M. Young; Edward S. Mao

[57] ABSTRACT

A power-on reset circuit is provided which uses a dual voltage detection circuit to output a voltage detection signal. The dual voltage detection circuit is coupled to a first supply voltage terminal, a second supply voltage terminal, and a ground terminal. The voltage detection signal indicates whether the first supply voltage provided on the first supply voltage terminal is greater than an adequate voltage level. Furthermore, the voltage detection signal is driven by circuits powered by a second supply voltage provided on the second supply voltage terminal. One embodiment of the dual-voltage detection circuit comprises a first transistor coupled in series with a second transistor between the first supply voltage terminal and the ground terminal, as well as a third transistor coupled in series with a fourth transistor between the second supply voltage terminal and the ground terminal. Furthermore, some embodiments of the present invention also include a low pass filter coupled to the dual-voltage detection circuit to prevent spurious noise and ground bounces from causing a reset.

11 Claims, 7 Drawing Sheets

POWER-ON RESET CIRCUIT FOR DUAL SUPPLY VOLTAGES

RELATED APPLICATION

This application is a divisional of U.S. patent application Ser. No. 09/003,474, now U.S. Pat. No. 6,078,201, entitled "Power-On Reset Circuit for Dual Supply Voltages" filed Jan. 6, 1998.

BACKGROUND OF THE INVENTION

1. Field of the Invention

The present invention relates to power-on reset circuits for integrated circuit (IC) devices. More specifically, the present invention relates to tunable power-on reset circuits for dual-voltage integrated circuit devices.

2. Discussion of Related Art

Power-on reset circuits are used in integrated circuit (IC) devices to insure proper functionality of the IC device when power is initially applied to the IC device and to insure proper functionality of the IC device if power to the IC device is temporarily lost. Power-on reset circuits typically prevent logic circuits from functioning until after the power-on reset circuit determines that the applied supply voltage is adequate. For example, memory circuits in the IC device, such as flip flops or SRAM cells, may be asynchronously held to a definite logic level (typically logic low) until the supply voltage to the IC device is adequate. Typically, a power-on reset circuit detects when a supply voltage Vcc transitions from less than to greater than an adequate voltage Vad. For convenience, supply voltage terminals are given the same name as the supply voltage. Thus, supply voltage Vcc is driven on a supply voltage terminal Vcc. When supply voltage Vcc surpasses adequate voltage Vad, the power-on reset circuit enables the logic circuits of the IC device. For CMOS devices, a minimum Vad is typically the sum of the threshold voltage of an N-type transistor (Vtn) and the threshold voltage of a P-type transistor (Vtp). Most power-on reset circuits adjust adequate voltage Vad to be greater than Vtn+Vtp to provide a margin for error in supply voltage Vcc.

Figure 1:
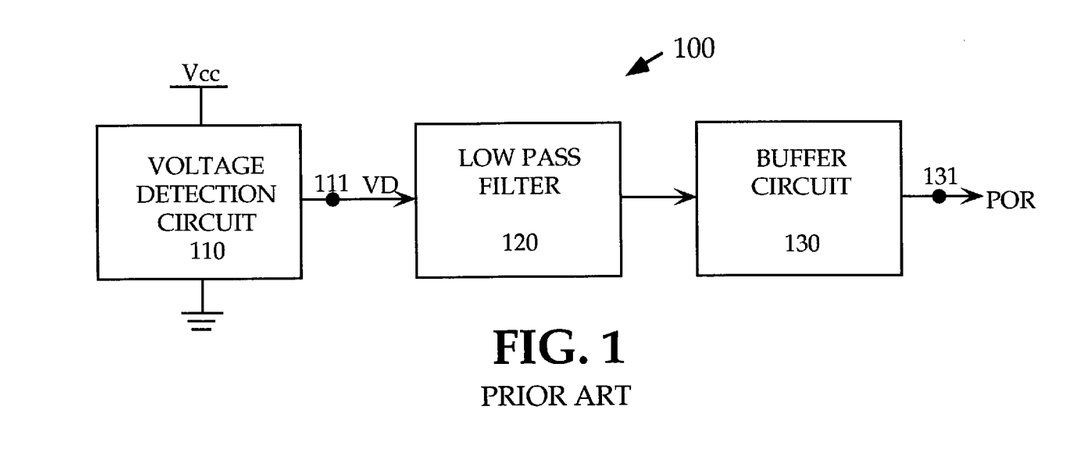
FIG. 1 is a block diagram of a conventional power-on reset circuit.

FIG. 1 shows a block diagram of a conventional power-on reset circuit 100. Voltage detection circuit 110, which is coupled between a supply voltage terminal Vcc and a ground terminal, detects when supply voltage Vcc is greater than adequate voltage Vad. If supply voltage Vcc is less than adequate voltage Vad, voltage detection circuit 110 drives a voltage detect signal VD on output terminal 111 of voltage detection circuit 110 to a power-off logic level (either logic low or logic high). If supply voltage Vcc is greater than adequate voltage Vad, voltage detection circuit 110 drives voltage detect signal VD on output terminal 111 of voltage detection circuit 110 to a power-on logic level (either logic low or logic high). Voltage detect signal VD of voltage detection circuit 110 is driven through a low pass filter 120 and a optional buffer circuit 130 to prevent spurious noise or ground bounces from accidentally causing a reset. In some embodiments, low pass filter 120 may invert the input signal and/or buffer circuit 130 may be an inverting buffer. Buffer circuit 130 outputs a power-on reset signal POR on output terminal 131. Power-on reset signal POR is distributed to the logic circuits of the IC device. Upon receiving an enabling power-on reset signal POR, the logic circuits can be set to a definite logic level or enabled to function. Some conventional power-on reset circuits are described by Lee in U.S. Pat. No. 5,394,104, entitled "Power-On Reset Circuit Including Dual Sense Amplifiers."

Due to the need for increased speed of IC devices, many IC devices use multiple supply voltage levels on a single integrated circuit device. As used herein, voltage supply circuits (not shown) provide a supply voltage on a supply voltage terminal. For clarity, the actual supply voltage on a supply voltage terminal and the supply voltage terminal are given the same reference name. Thus, for example "supply voltage Vcc1" refers to the actual voltage level found on "supply voltage terminal Vcc1". Each voltage supply circuit attempts to drive the supply voltage to a specific target voltage. The target voltage for the supply voltage circuit providing supply voltage Vcc1 is called the "Vcc1 target voltage."

Some microprocessors and programmable devices, such as field programmable gate arrays and programmable logic devices, use a first supply voltage Vcc1 for input/output logic circuits and a second supply voltage Vcc2 for internal logic circuits. Typically, transistors using lower supply voltages are able to switch logic levels at a faster rate. However, input/output logic circuits may require higher supply voltages to communicate to other IC devices on printed circuit boards. Thus, the Vcc1 target voltage for the input/output logic circuits is typically greater than the Vcc2 target voltage for the internal logic circuits. When a circuit is partly powered up, second supply voltage Vcc2 may be adequate, while first supply voltage Vcc1 may be inadequate. Under these conditions, the logic circuits which receive first supply voltage Vcc1 and provide signals to the logic circuits which receive second supply voltage Vcc2 would provide erroneous signals. Therefore, even the logic circuits which receive second supply voltage Vcc2 are likely to produce erroneous results. Thus, on IC devices with multiple supply voltages, there is a need for a power-on reset circuit to reset logic circuits which use a second supply voltage if a first supply voltage becomes inadequate.

SUMMARY

Accordingly, the present invention detects supply voltage failure of a first voltage supply and can reset the logic circuits which use a second voltage supply. In accordance with one embodiment of the invention, a dual voltage detection circuit is coupled to receive a first supply voltage from a first supply voltage terminal, a second supply voltage from a second supply voltage terminal, and a ground supply voltage from a ground terminal. The dual voltage detection circuit is configured to detect when the first supply voltage drops below an adequate voltage Vad. Upon detecting this condition, the dual voltage detection circuit asserts a power-off logic level on a voltage detection signal, which resets the circuitry powered by the second voltage supply terminal. The voltage detection signal is driven by circuitry powered from the second supply voltage terminal, so that even a logic high on the voltage detection circuit is less than a second supply voltage provided on the second supply voltage terminal. Consequently, the logic circuits receiving the voltage detection signal are not subject to voltage levels which may damage the circuits.

Some embodiments of the present invention use a dual-voltage detection circuit which comprises a first transistor and a second transistor coupled in series between the first supply voltage terminal and the ground terminal, as well as a third transistor and a fourth transistor coupled in series between the second supply voltage terminal and the ground terminal. Specifically, the first transistor has a first power terminal coupled to the first supply voltage terminal, a second power terminal, and a gate terminal coupled to the second power terminal. The second transistor has a first power terminal coupled to the second power terminal of the first transistor, a second power terminal coupled to the ground terminal, and a gate terminal coupled to either the first supply voltage terminal or the second supply voltage terminal. The third transistor has a first power terminal coupled to the second supply voltage terminal, a second power terminal, and a gate terminal coupled to the ground terminal. The fourth transistor has a first power terminal coupled to the second power terminal of the third transistor, a second power terminal coupled to the ground terminal, and a gate terminal coupled to the first power terminal of the second transistor. The voltage detection signal is provided on the second power terminal of the third transistor, which is coupled to the first power terminal of the fourth transistor.

In some embodiments of the present invention, a low pass filter is coupled to receive the voltage detection signal from the dual-voltage detection circuit. The low pass filter prevents spurious noise or ground bounce from erroneously causing a reset. The low pass filter can be implemented using a logic gate and a delay line circuit.

In one embodiment, the delay line circuit has an input terminal which is coupled to receive the voltage detection signal from the dual-voltage detection circuit. The logic gate has a first input terminal coupled to receive the voltage detection signal from the dual-voltage detection circuit, and a second input terminal coupled to the output terminal of the delay line circuit. The logic gate outputs a filtered version of the voltage detection signal.

In some embodiments of the present invention, a power-on reset circuit also includes a voltage detection circuit, a second low pass filter, and a buffer circuit. The voltage detection circuit provides a second voltage detection signal to indicate whether the second supply voltage from the second supply voltage terminal is above a second adequate voltage. The second low pass filter prevents spurious noise or ground bounces from causing resets. The buffer gate is coupled to the first and second low pass filters to output a power-on reset signal if either voltage detection signal indicates an inadequate supply voltage. Furthermore, some embodiments of the present invention also include a memory test circuit which provides a signal to indicate whether a supply voltage is high enough to write both a logic high and a logic low into a memory cell.

Thus the present invention provides power-on reset circuits which can be used in IC devices having multiple supply voltages. The present invention will be more fully understood in view of the following description and drawings.

DETAILED DESCRIPTION

Figure 2:
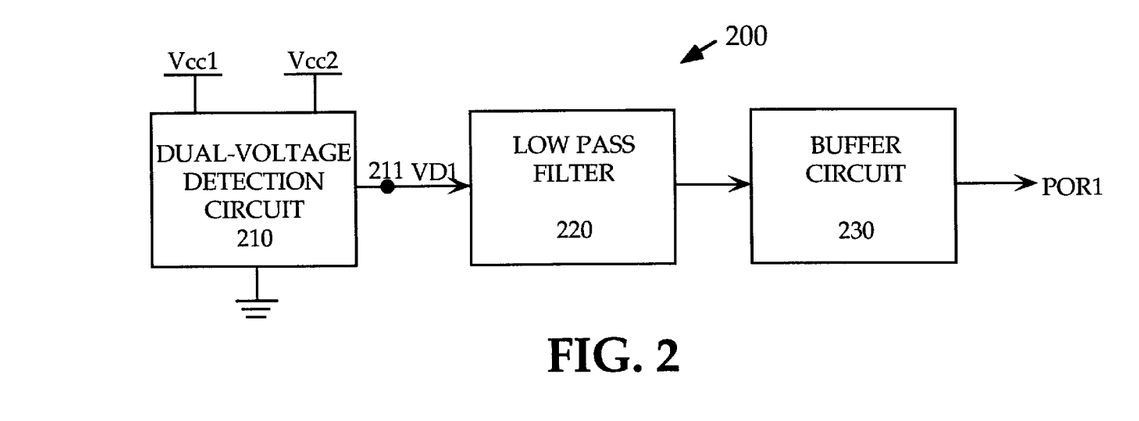
FIG. 2 is a block diagram of a power-on reset circuit in accordance with one embodiment of the present invention.

FIG. 2 is a block diagram of a power-on reset circuit 200 in accordance with one embodiment of the present invention. Power-on reset circuit 200 includes a dual-voltage detection circuit 210 coupled to a first supply voltage terminal Vcc1, a second supply voltage terminal Vcc2, and a ground terminal. In one embodiment, the Vcc1 target voltage is 3.3 volts, the Vcc2 target voltage is 2.5 volts, and ground is zero volts. In another embodiment of the present invention, the Vcc1 target voltage is 1.8 volts and the Vcc2 target voltage is 2.5 volts. Other voltages are possible and consequently are within the scope of the invention.

Dual-voltage detection circuit 210 determines whether supply voltage Vcc1 is greater than a first adequate voltage level Vad1, and in response outputs a first voltage detection signal VD1. Circuitry coupled to second supply voltage terminal Vcc2 drives first voltage detection signal Vd1 on output terminal 211. More, specifically, if first supply voltage Vcc1 is less than first adequate voltage Vad1, dual-voltage detection circuit 210 drives first voltage detection signal VD1 to a power-off logic level (e.g. logic high for active low signals). If first supply voltage Vcc1 is greater than first adequate voltage Vad1, dual-voltage detection circuit 210 drives first voltage detection signal VD1 to a power-on logic level (e.g. logic low for active low signals). For reasons which will become apparent in view of the subsequent disclosure, the logic high level for first voltage detection signal VD1 is approximately one p-type transistor voltage drop less than supply voltage Vcc2. In an embodiment having a Vcc2 target voltage of 2.5 volts, logic high for first voltage detection signal VD1 is typically between 1.8 and 2.5 volts. First voltage detection signal Vd1 indicates the status of first supply voltage Vcc1 on first supply voltage terminal Vcc1. If the first supply voltage becomes inadequate, the circuitry powered by supply voltage Vcc2 is reset to avoid receiving erroneous data from the circuitry supplied by first supply voltage Vcc1.

To prevent spurious noise and ground bounce from causing unnecessary resets, first voltage detection signal VD1 is driven through a low pass filter 220. In some embodiments of power-on reset circuit 200, low pass filter 220 is designed to eliminate detection of false power losses. In these embodiments low pass filter 220 need only remove shortlived occurrences of first voltage detection signal VD1 being in the power-off logic level. The output signal from low pass filter 220 is driven to an optional buffer circuit 230, which drives a power-on reset signal POR1. In some embodiments of power-on reset circuit 200, low pass filter 220 may invert the input signal and/or buffer circuit 230 may be an inverting buffer.

Figures 3A, 3B:
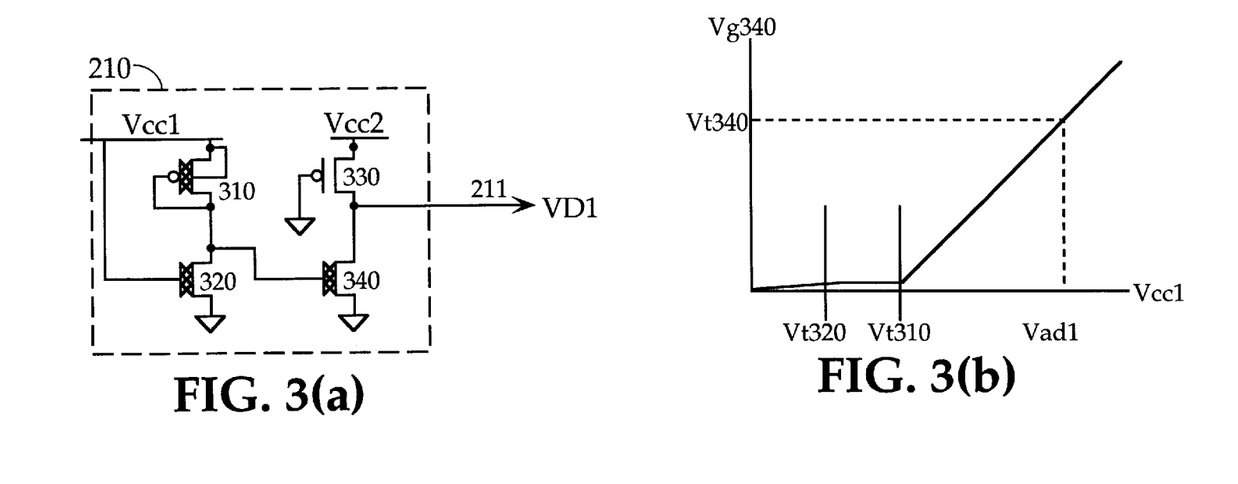
FIG. 3(a) is a schematic diagram of a dual-voltage detection circuit in accordance with one embodiment of the present invention.
FIG. 3(b) is a voltage graph for the voltage detection circuit of FIG. 3(a).

FIG. 3(a) is a schematic diagram for one embodiment of dual-voltage detection circuit 210, which determine the status of supply voltage Vcc1. In FIG. 3(a), dual-voltage detection circuit 210 includes thick gate oxide P-type transistor 310, thick gate oxide N-type transistor 320, thick gate oxide N-type transistor 340, and P-type transistor 330. As used herein, a thick gate oxide transistor is a transistor having a gate oxide thickness which is large enough to allow a relatively high voltage to be applied to the gate of the transistor without damaging the transistor. Thick gate oxide transistors are denoted in the figure by using cross marks between the gate and body of the transistors. In the embodiments of FIG. 3(a), the Vcc1 target voltage is greater than the Vcc2 target voltage, thus transistors 310, 320 and 340, which are coupled to receive supply voltage Vcc1 or have gates driven by circuitry receiving supply voltage Vcc1 are thick gate oxide transistors. Transistor 330, which is coupled to supply voltage terminal Vcc2 has a standard gate oxide thickness.

Figure 3C:
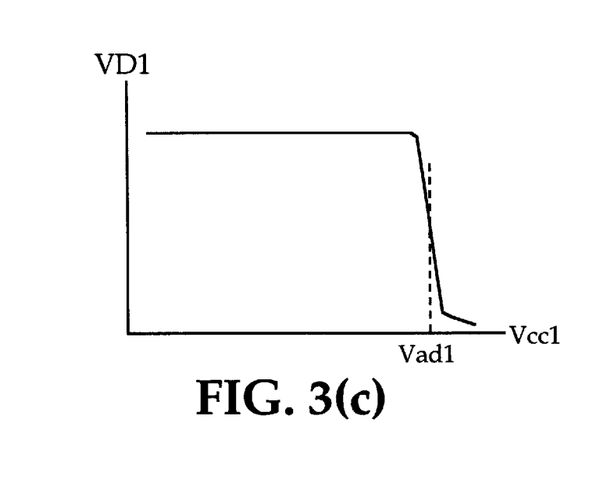
FIG. 3(c) is another voltage graph for the voltage detection circuit of FIG. 3(a).
Figure 3D:
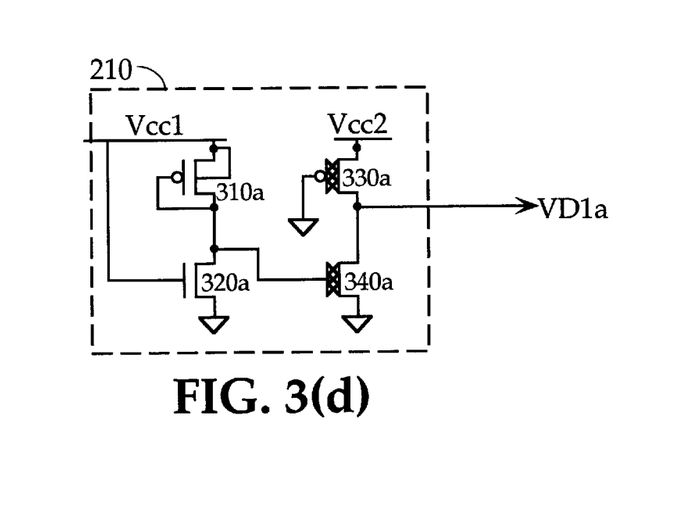
FIG. 3(d) is a schematic diagram of a dual-voltage detection circuit in accordance with one embodiment of the present invention.

In the embodiment of FIG. 3(d), the Vcc2 target voltage is greater than the Vcc1 target voltage. Thus transistors 330a and 340, which are coupled to receive supply voltage Vcc2 are thick gate oxide transistors. Transistors 310a and 320a, which are coupled to receive supply voltage Vcc1, are standard oxide transistors. One skilled in the art will appreciate that the principles of the present invention can be used with circuits in which thick gate oxide transistors are replaced with other forms of high voltage transistors.

In FIG. 3(a), thick gate oxide P-type transistor 310 is coupled in series with a thick gate oxide N-type transistor 320 between supply voltage terminal Vcc1 and a ground terminal. Specifically, a first power terminal of transistor 310 is coupled to supply voltage terminal Vcc1; a second power terminal of transistor 310 is coupled to a first power terminal of transistor 320; and a second power terminal of transistor 320 is coupled to a ground terminal. In some embodiments, the body of transistor 310 is also coupled to supply voltage terminal Vcc1 to prevent formation of a parasitic forward biased diode between supply voltage terminal Vcc1 and supply voltage terminal Vcc2.

The gate terminal of transistor 310 is coupled to the second power terminal of transistor 310 and to the first power terminal of transistor 320. The gate terminal of transistor 320 is coupled to supply voltage terminal Vcc1. The second power terminal of transistor 310 and the first power terminal of transistor 320 are coupled to the gate terminal of a thick gate oxide N-type transistor 340, which is coupled in series with a P-type transistor 330 between supply voltage terminal Vcc2 and a ground terminal. Specifically, a first power terminal of transistor 330 is coupled to supply voltage terminal Vcc2, a second power terminal of transistor 330 is coupled to a first power terminal of transistor 340, and a second power terminal of transistor 340 is coupled to a ground terminal. The gate terminal of transistor 330 is also coupled to a ground terminal.

The second power terminal of transistor 330 and the first power terminal of transistor 340 drive first voltage detection signal VD1 to output terminal 211. In the embodiment of FIG. 3(a), the power-off logic level for first voltage detection signal VD1 is logic high, while the power-on logic level is logic low. Thus, first voltage detection signal VD1 is an active low signal.

If supply voltage Vcc2 is inadequate, i.e. less than adequate voltage Vad2, circuits supplied by supply voltage Vcc2 will not function properly regardless of the state of supply voltage Vcc1. Therefore, dual voltage detection circuit 210 need only supply an enabling signal when supply voltage Vcc2 is adequate, i.e. greater than a second adequate voltage Vad2. Assuming supply voltage Vcc2 is adequate and supply voltage Vcc1 is not, transistor 330 pulls first voltage detection signal VD1 to logic high, i.e. to the power-off logic level. If supply voltage Vcc1 is greater than an adequate voltage Vad1, transistor 340 drives first voltage detection signal VD1 to logic low, i.e. to the power-on logic level. Transistor 340 is controlled by transistors 310 and 320. As explained below, for the embodiment of FIG. 3(a), adequate voltage Vad1 is tunable by selecting the relative sizes of transistors 310 and 320. However, adequate voltage Vad1 is greater than the sum of the threshold voltage of transistor 310 (Vt310) and the threshold voltage of transistor 340 (Vt340). In an embodiment of the present invention with the Vcc1 target voltage equal to 3.3 volts, the threshold voltages of transistor 310 is approximately 0.7 volts, and the threshold voltage of transistor 320 is approximately 0.6 volts. Consequently, first adequate voltage Vad1 is greater than 1.3 volts.

FIG. 3(b) provides a voltage graph of the gate voltage of transistor 340 (Vg340) versus supply voltage Vcc1 assuming supply voltage Vcc2 is above second adequate voltage Vad2. When the voltage supply circuit supplying supply voltage Vcc1 is off, the gate terminal of transistor 320 is not driven. Therefore, the gate voltage of transistor 340 (Vg340) sinks near ground level. When supply voltage Vcc1 rises above the threshold voltage of transistor 320 (Vt320), transistor 320 turns on and pulls the gate terminal of transistor 340 to logic low. In some embodiments of the present invention, the gate terminal of transistor 320 is coupled to supply voltage terminal Vcc2 rather than supply voltage terminal Vcc1 so that the gate voltage of transistor 340 (Vg340) is pulled to logic low even if supply voltage Vcc1 is inadequate.

When supply voltage Vcc1 rises above the threshold voltage of transistor 310 (Vt310), transistor 310 begins to pull the gate terminal of transistor 340 towards logic high. After supply voltage Vcc1 rises above the threshold voltage of transistor 310 (Vt310), the gate voltage of transistor 340 (Vg340) rises with supply voltage Vcc1 but is less than supply voltage Vcc1 by at least the threshold voltage of transistor 310 (Vt310) since transistor 310 is diode connected between supply voltage terminal Vcc1 and the gate terminal of transistor 340. The ratio of supply voltage Vcc1 to the gate voltage of transistor 340 (Vg340) depends on the driving strengths of transistors 310 and 320. As is well known in the art, the driving strength of a transistor is proportional to the width of the channel divided by the length of the channel (i.e. the w/l ratio). Increasing the driving strength of transistor 310 increases the rate at which the gate voltage of transistor 340 (Vg340) increases with an increase in supply voltage Vcc1. Conversely, increasing the driving strength of transistor 320 decreases the rate at which the gate voltage of transistor 340 (Vg340) increases with an increase in supply voltage Vcc1.

When the gate voltage of transistor 340 (Vg340) is greater than the threshold voltage of transistor 340 (Vt340), thick gate oxide N-type transistor 340 pulls first voltage detection signal VD1 to the power-on logic level (logic low for the embodiment of FIG. 3(a)). Thus as shown in FIG. 3(c), when supply voltage Vcc1 surpasses adequate voltage Vad1, first voltage detection signal VD1 transitions to logic low. Since transistor 340 must contend with transistor 330, the driving strength of transistor 340 must be greater than the driving strength of transistor 330. Furthermore, to conserve power, the driving strength of transistor 330 should be relatively small.

As explained above, the various voltages of the transistors in FIG. 3(a) are related by the following equations when first voltage detection signal VD1 is in the power-on logic state:

$$Vcc1 > Vg340 + Vt310 \quad (1)$$

$$Vg340 > Vt340 \quad (2)$$

Combining equations (1) and (2) shows that:

$$Vcc1 > Vt340 + Vt310 \quad (3)$$

Thus, supply voltage Vcc1 must be greater than the threshold voltage of transistor 340 (Vt340) plus the threshold voltage of transistor 310 (Vt310) for transistor 340 to pull first voltage detection signal VD1 to the power-on logic state. Thus, adequate voltage Vad1 for the circuit of FIG. 3(a) is greater than the threshold voltage of a P-type transistor plus the threshold voltage of an N-type transistor, as is recommended for most CMOS circuits.

The exact value of supply voltage Vcc1 necessary to pull first voltage detection signal VD1 to the power-on logic level can be tuned by adjusting the driving strength (for example by adjusting the w/l ratio) of transistors 310 and 320. Increasing the driving strength of transistor 310 decreases the value of supply voltage Vcc1 necessary to pull first voltage detection signal VD1 to the power-on logic level. Conversely, increasing the driving strength of transistor 320 increases the value of supply voltage Vcc1 necessary to pull first voltage detection signal VD1 to the power-on logic level. In an embodiment of dual-voltage detection circuit 210 in which the Vcc1 target voltage is 3.3 volts and the Vcc2 target voltage is 2.5 volts; the w/l ratios of transistors 310, 320, 330, and 340 are 20/2, 4/40, 4/40, and 40/1, respectively.

If the Vcc2 target voltage is greater than the Vcc1 target voltage, the embodiment of FIG. 3(a) is modified as illustrated in FIG. 3(d). Specifically, transistor 310 is replaced with a P-type transistor 310a, transistor 320 is replaced with an N-type transistor 320a, and P-type transistor 330 is replaced with a thick gate oxide P-type transistor 330a. Since the functionality of the embodiment of FIG. 3(d) is very similar to the functionality of the embodiment of FIG. 3(a), the description is not repeated. FIG. 3(d) can also be modified to replace N-type transistor 320a with a thick oxide N-type transistor having a gate terminal coupled to supply voltage terminal Vcc2.

Figure 4A:
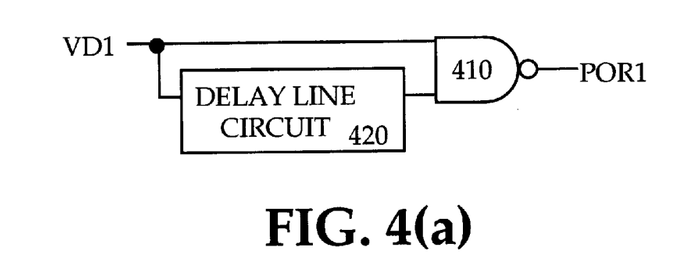
FIG. 4(a) is a schematic diagram of a low pass filter used in some embodiments of the present invention.

FIG. 4(a) shows an embodiment of low pass filter 220 for use with embodiments of dual-voltage detection circuit 210 with an active-low first voltage detection signal VD1. Specifically, the low pass filter of FIG. 4(a) removes high frequency logic high levels from an input signal and inverts the input signal to output a logic high power-on reset signal POR1. Thus, the low pass filter of FIG. 4(a) is well suited for receiving first voltage detection signal VD1 from the dual-voltage detection circuit in FIG. 3(a). First voltage detection signal VD1 is coupled to a first input terminal of a NAND gate 410 as well as an input terminal of a delay line circuit 420. An output terminal of delay line circuit 420 is coupled to a second input terminal of NAND gate 410. A power-on reset signal POR1 is generated on an output terminal of NAND gate 410. If first voltage detection signal VD1 is at logic low, power-on reset signal POR1 is driven to logic high (the power-on logic level). If first voltage detection signal VD1 is at logic high long enough for the logic high level to propagate through delay line circuit 420 so that the logic level at both input terminals of NAND gate 410 are at logic high, NAND gate 410 drives power-on reset signal POR1 to a logic low level (the power-off logic level). However, if first voltage detection signal VD1 is at logic high only momentarily and the second input terminal of NAND gate 410 remains at logic low due to delay line circuit 420 until after first voltage detection signal VD1 returns to logic low, NAND gate 410 does not drive power-on reset signal POR1 to a logic low level. Thus temporary loss of adequate voltage in supply voltage Vcc1 due to problems such as spurious noise and ground bounce does not cause a reset. The amount of delay in delay line circuit 420 should be less than an amount to cause circuit elements in the remainder of the IC device to function improperly.

Figure 4B:
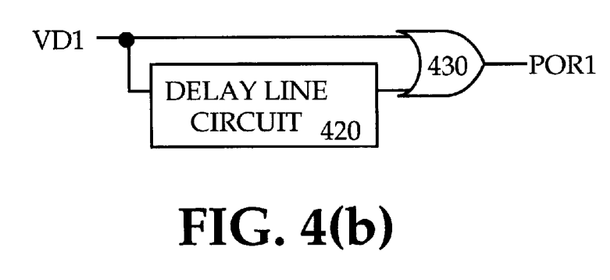
FIG. 4(b) is a schematic diagram of another low pass filter used in some embodiments of the present invention.

If first voltage detection signal VD1 is an active high signal, the low pass filter of FIG. 4(a) can be used by inserting an inverter to receive first voltage detection signal VD1 and coupling the output terminal of the inverter to the first input terminal of NAND gate 410 and the input terminal of delay line circuit 420. Alternatively, NAND gate 410 can be replaced by an OR gate 430 as shown in FIG. 4(b). In CMOS logic, OR gates are typically implemented as a NOR gate and an inverter.

Figure 5A:
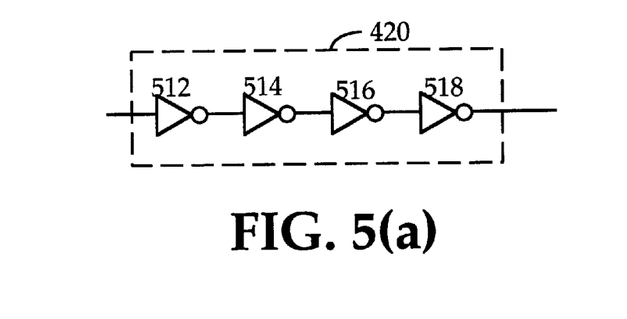
FIG. 5(a) is a schematic diagram of a delay line circuit used in some embodiments of the present invention.
Figure 5B:
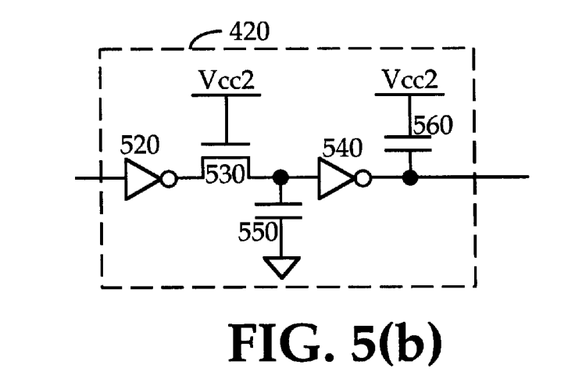
FIG. 5(b) is a schematic diagram of another delay line circuit used in some embodiments of the present invention.

FIG. 5(a) shows an embodiment of a delay line circuit 420. Specifically, the embodiment of FIG. 5(a) comprises four inverters coupled in series. Any even number of inverters in series can be used to create a delay line circuit. Additional inverters increase the amount of delay in the circuit. FIG. 5(b) shows another embodiment of delay line circuit 420. Specifically, the embodiment of FIG. 5(b) comprises an inverter 520 coupled to receive an input signal to the input terminal of delay line circuit 420. The output terminal of inverter 520 is coupled to the input terminal of an inverter 540 through an N-type pass transistor 530, (a long-channel transistor included to provide resistance) which has a gate terminal coupled to supply voltage terminal Vcc2. A capacitor 550 is coupled between the input terminal of inverter 540 and a ground terminal. The capacitance of capacitor 550 delays the transitions of the output signal of transistor 530. The output terminal of inverter 540 is coupled to the output terminal of delay line circuit 420. A capacitor 560 is coupled between the output terminal of inverter 540 and supply voltage terminal Vcc2. The capacitance of capacitor 540 delays the transitions of the output signal from inverter 540.

The overall delay of delay line circuit 420 can be tuned by adjusting the capacitance of capacitor 550 and capacitor 560 or by adjusting the driving strength of transistor 530, inverter 520, and inverter 540. Increasing the capacitance of either capacitor 550 or capacitor 560 increases the delay. However, increasing the drive strength of inverter 520, inverter 540, or transistor 530 decreases the delay. In one embodiment of delay line circuit 420 in which the Vcc2 target voltage is 2.5 Volts: inverter 520 comprises a P-type transistor with a w/l ratio of 3.6/3.6 and a N-type transistor with a w/l ratio of 4/8; N-type pass transistor 530 has a w/l ratio of 3/8; inverter 540 comprises high threshold P-type transistor with a w/l ratio of 2.4/0.8, and an N-type transistor with a w/l ratio of 7.7/0.8; capacitor 550 is an N-diffusion poly capacitor with area 289 $\mu m^2$ and a capacitance of 20 ff; and P-diffusion capacitor 560 has area 200 $\mu m^2$ and capacitance of 10 ff.

Figure 6:
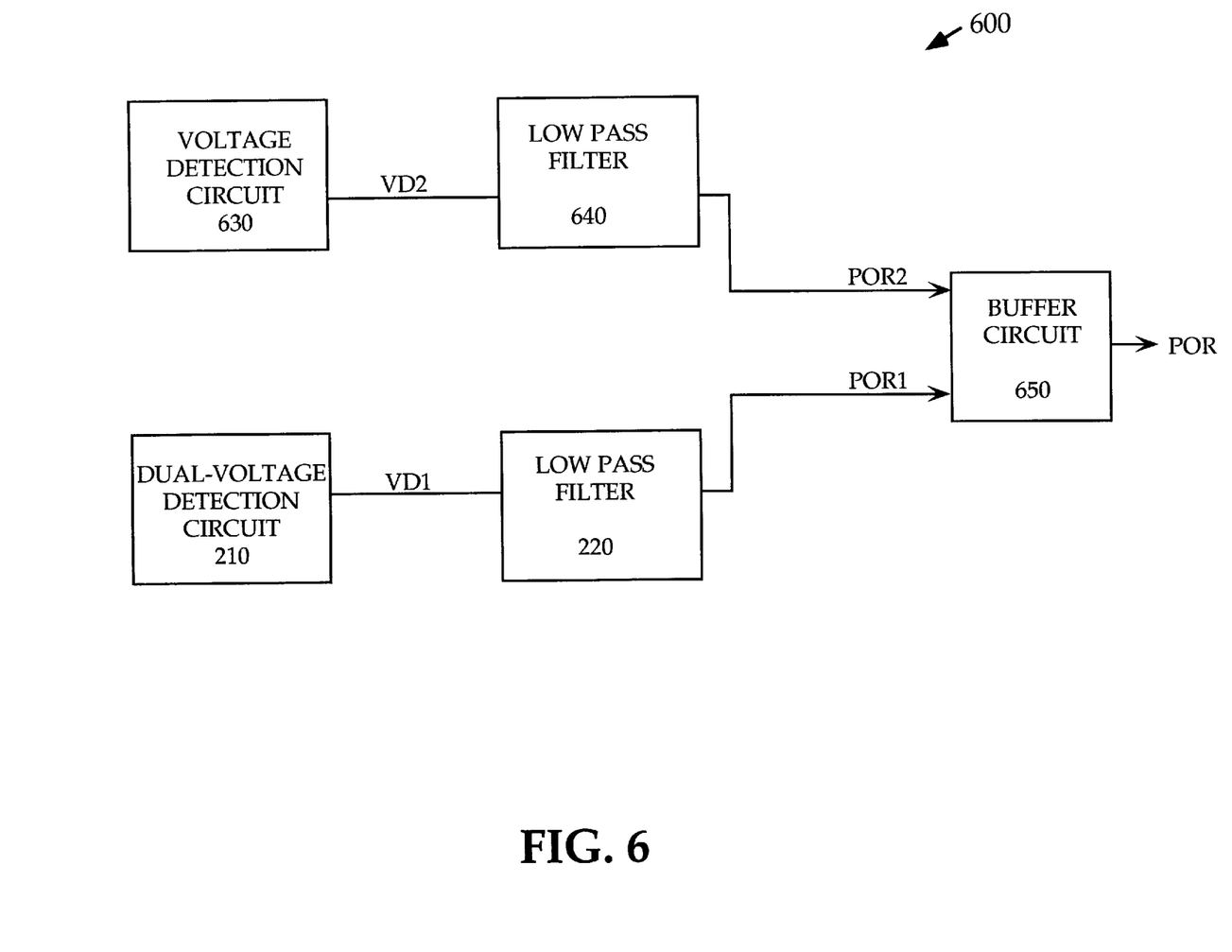
FIG. 6 is a block diagram of a power-on reset circuit in accordance with one embodiment of the invention.

FIG. 6 shows a block diagram of a power-on reset circuit 600, which uses the previously described dual-voltage detection circuit 210 and low pass filter 220. Power-on reset circuit 600 also detects power failures for the second supply voltage (Vcc2). Thus, power-on reset circuit 600 includes a voltage detection circuit 630 coupled between supply voltage terminal Vcc2 and a ground terminal. Voltage detection circuit 630 drives a second voltage detection signal VD2 indicative of whether supply voltage Vcc2 is greater than a second adequate voltage level (Vad2). Specifically, voltage detection circuit 630 drives second voltage detection signal VD2 to a power-on logic level if supply voltage Vcc2 is greater than adequate voltage Vad2 and to a power-off logic level if supply voltage Vcc2 is less than adequate voltage Vad2. Second voltage detection signal VD2 passes through low pass filter 640 which removes short transient power-off logic levels to produce a second power-on reset signal POR2 for supply voltage Vcc2. Power-on reset signal POR1 and power-on reset signal POR2 are coupled to a buffer circuit 650. Buffer circuit 650 outputs a power-on reset signal POR, which is in the power-off logic level if supply voltage Vcc1 is less than adequate voltage Vad1 or if supply voltage Vcc2 is less than adequate voltage Vad2 for longer than a transient period of time.

Figure 7:
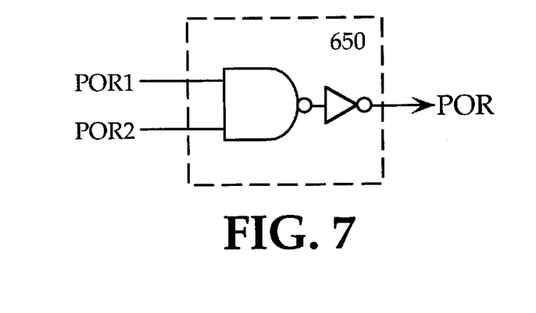
FIG. 7 is a schematic diagram of a buffer circuit used in some embodiments of the present invention.

Buffer circuit 650 can be an AND gate, which is usually implemented as a NAND gate and an inverter as shown in FIG. 7. Low pass filter 640 can be implemented in the same manner as low pass filter 220 described above with respect to FIGS. 4(a), 4(b), 5(a) and 5(b). Voltage detection circuit 630 can be implemented by the circuit of FIG. 8(a) or using a conventional voltage detection circuit such as those described by Lee in U.S. Pat. No. 5,394,104, entitled "Power-On Reset Circuit Including Dual Sense Amplifiers," which is incorporated herein by reference.

Figure 8A:
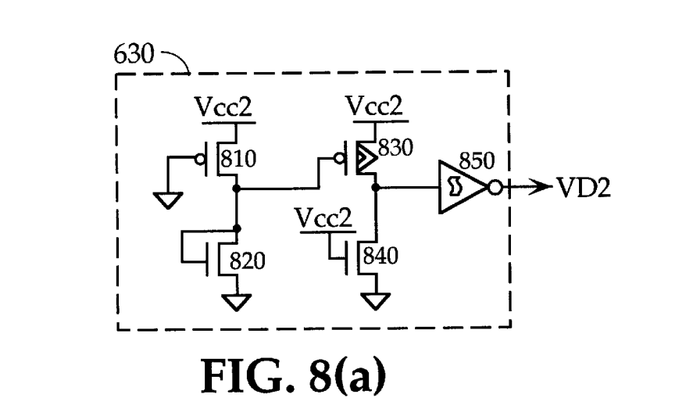
FIG. 8(a) is a schematic diagram of a voltage detection circuit in accordance with one embodiment of the present invention.

In FIG. 8(a), a P-type transistor 810 is coupled in series with a diode-connected N-type transistor 820 between supply voltage terminal Vcc2 and a ground terminal. Specifically, a first power terminal of P-type transistor 810 is coupled to supply voltage terminal Vcc2, a second power terminal of P-type transistor 810 is coupled to a first power terminal of N-type transistor 820, and a second power terminal of N-type transistor 820 is coupled to a ground terminal. The gate terminal of P-type transistor 810 is also coupled to a ground terminal. The second power terminal of P-type transistor 810 is coupled to the gate terminal of a high threshold P-type transistor 830 (high threshold transistors are denoted by the triangles on the body of the transistors, such as P-type transistor 830). A high threshold transistor has a greater threshold voltage than normal transistors. However, use of a high threshold transistor is not necessary for the circuit of FIG. 8(a). Transistor 830 is coupled in series with an N-type transistor 840 between supply voltage terminal Vcc2 and a ground terminal. Specifically, a first power terminal of transistor 830 is coupled to supply voltage terminal Vcc2, a second power terminal of transistor 830 is coupled to a first power terminal of transistor 840, and a second power terminal of transistor 840 is coupled to a ground terminal. The gate terminal of transistor 840 is coupled to supply voltage terminal Vcc2. The second power terminal of transistor 830 is coupled to the input of a Schmitt trigger inverter 850 which outputs second voltage detection signal VD2. Second voltage detection signal VD2 is an active low signal so that the power-on logic level is logic low while the power-off logic level is logic high.

Figure 8B:
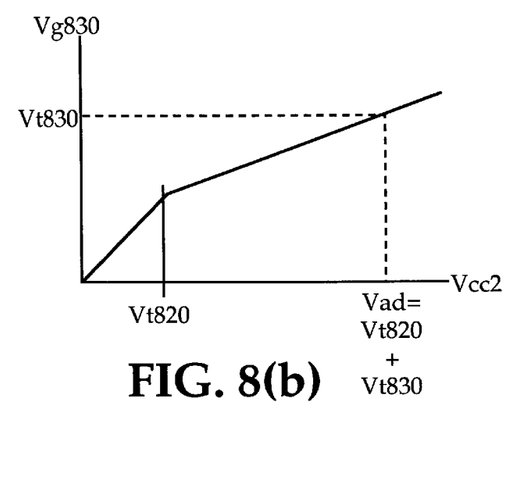
FIG. 8(b) is a voltage graph of the voltage detection circuit of FIG. 8(a).
Figure 8C:
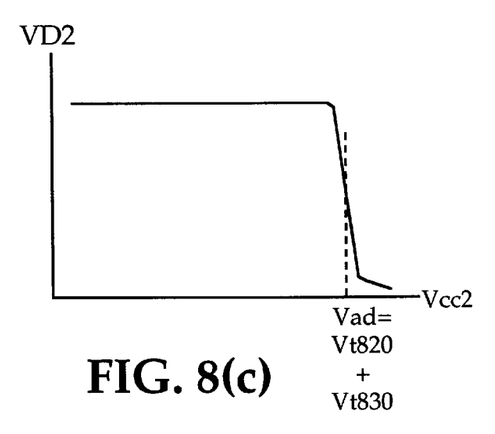
FIG. 8(c) is another voltage graph of the voltage detection circuit of FIG. 8(a).

FIG. 8(b) shows a voltage graph for the gate voltage of transistor 830 (Vg830) versus supply voltage Vcc2. FIG. 8(c) shows a voltage graph for voltage detection signal Vd2 versus supply voltage Vcc2. Until supply voltage Vcc2 reaches the threshold voltage of N-type transistor 820 (Vt820), no current flows through transistor 820, and the gate voltage of transistor 830 (Vg830) is pulled to approximately supply voltage Vcc2 by transistor 810. Once, supply voltage Vcc2 reaches the threshold voltage of transistor 820 (Vt820), the gate voltage of transistor 830 (Vg830) is approximately equal to supply voltage Vcc2 minus the threshold voltage of transistor 820 (Vt820); since transistor 820 is diode-connected to a ground terminal, which causes a voltage drop from the gate of transistor 830 (Vg830) equal to the threshold voltage of transistor 820 (Vt820). When the gate-to-source voltage of transistor 830 (Vg830) reaches the threshold voltage of transistor 830 (Vt830), transistor 830 begins to pull the input terminal of Schmitt trigger inverter 850 to logic high. The gate to source voltage of transistor 830 is equal to the supply voltage Vcc2 minus the gate voltage of transistor 830 (Vg830). When the input terminal of inverter 850 is pulled to logic high, inverter 850 pulls voltage detection circuit VD2 low, the power-on logic level. Thus, for voltage detection circuit VD2 to signal adequate power, the gate voltage of transistor 830 (Vg830) must be greater than its threshold voltage (Vt830).

As explained above, the gate voltage of transistor 830 (Vg830) is approximately equal to supply voltage Vcc2 minus the threshold voltage of transistor 820 (Vt820). Thus, as illustrated in FIG. 8(c), supply voltage Vcc2 must be greater than the threshold voltage of transistor 820 (Vt820) plus the threshold voltage of transistor 830 (Vt830) to cause voltage detection signal VD2 to be pulled to the power-on logic level. Thus, the adequate voltage Vad2 for the circuit of FIG. 8(a) is the threshold voltage of an N-type transistor plus the threshold voltage of a P-type transistor, as is recommended for most CMOS circuits.

Figure 9:
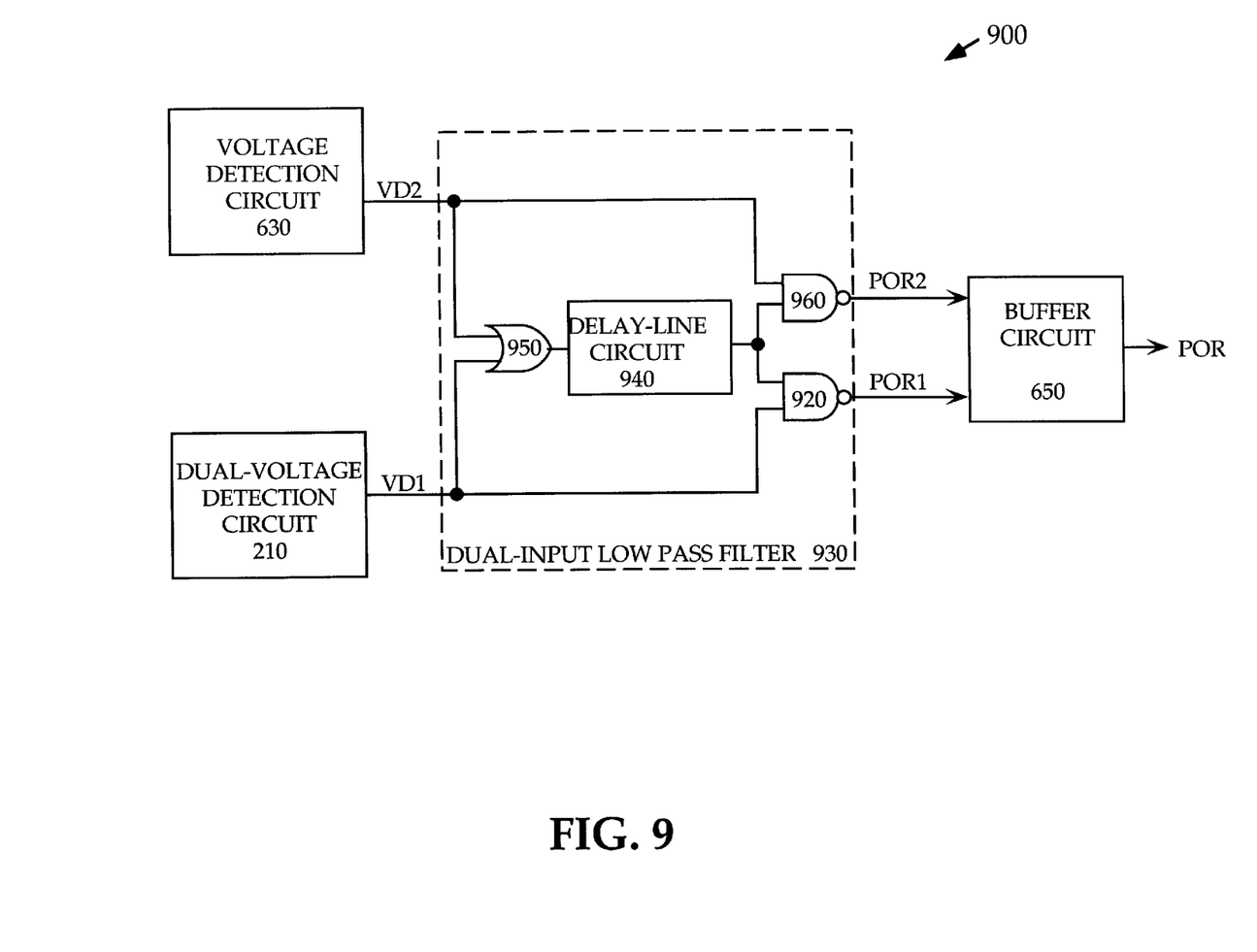
FIG. 9 is a block diagram of a power-on reset circuit in accordance with one embodiment of the present invention.

FIG. 9 is a block diagram of a power-on reset circuit 900 which replaces low pass filter 640 and low pass filter 620 in power-on reset circuit 600 (FIG. 6), with a dual-input low pass filter 930. Dual-input low pass filter 930 requires only one delay line circuit 940 as opposed to one for each low pass filter used in power-on reset circuit 600. First voltage detection signal VD1 is coupled to a first input terminal of an OR gate 950 and a first input terminal of a NAND gate 970. Second voltage detection circuit VD2 is coupled to a second input terminal of OR gate 950 and a first input terminal of NAND gate 960. The output terminal of OR gate 950 is coupled to an input terminal of delay line circuit 940. The output terminal of delay line circuit 940 is coupled to the second input terminal of NAND gate 960 and the second input terminal of NAND gate 970. NAND gate 970 drives first power-on reset signal POR1 and NAND gate 960 drives second power-on reset signal POR2.

Since both first voltage detection signal VD1 and second voltage detection signal VD2 are active low, the output of OR gate 950 becomes logic high if either first voltage detection signal VD1 or second voltage detection signal VD2 are in the power-off logic level (i.e. logic high). Thus with regard to first voltage detection signal VD1, delay line circuit 940 and NAND gate 970 form a low pass filter similar to the low pass filter of FIG. 4(a). Similarly, with respect to second voltage detection signal VD2, delay line circuit 940 and NAND gate 960 form a low pass filter similar to the low pass filter of FIG. 4(a). In actual CMOS implementation, if delay line circuit 940 uses an input inverter such as inverter 512 (FIG. 5(a)) or inverter 520 (FIG. 5(b)), the inverter and OR gate 950 should be implemented as a single NOR gate. For active-high voltage detection signals, OR gate 950 can be replaced with a NAND gate, while NAND gate 960 and NAND gate 970 can be replaced with OR gates. Alternatively, input inverters can be used to receive the active-high voltage detection signals.

Figure 10:
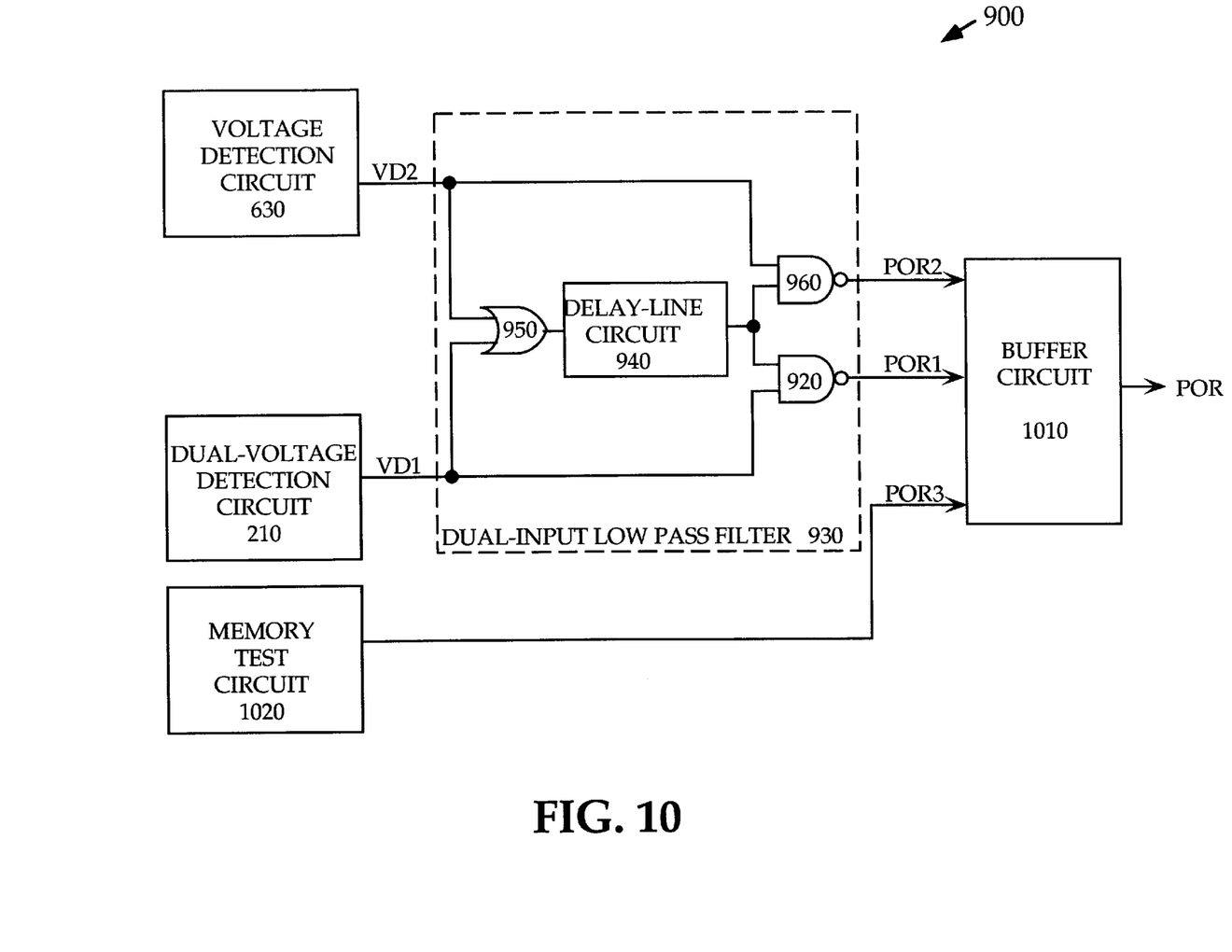
FIG. 10 is a block diagram of a power-on reset circuit in accordance with one embodiment of the present invention.

For embodiments of the present invention used in IC devices containing memory cells, a memory test circuit can be incorporated into the power-on reset circuit. As shown in FIG. 10, a power-on reset circuit 1000 is similar to the power-on reset circuit of FIG. 9 but a buffer circuit 1010 replaces buffer circuit 650 and a memory test circuit 1020 is coupled to buffer circuit 1010. One embodiment of buffer circuit 1010 comprises a three-input AND gate implemented using a three input NAND gate and an inverter. Memory test circuit 1020 is of conventional design, such as the one described by Lee in U.S. Pat. No. 5,394,104. Memory test circuit 1010 outputs a third power-on reset signal POR3 indicative of whether a supply voltage is high enough to write both a logic high into a memory cell and a logic low into a memory cell. Buffer circuit 1010 drives a power on reset signal POR which transitions to the power-off logic level if one or more of power on reset signals POR1, POR2, and POR3 are in the power-off logic level. In the various embodiments of this invention, novel structures have been described for power-on reset circuits for use in multiple voltage IC devices. By detecting inadequate voltage from one voltage supply and resetting circuits using another voltage supply, the present invention prevents the IC device from using potentially erroneous data. The various embodiments of the structures and methods of this invention that are described above are illustrative only of the principles of this invention and are not intended to limit the scope of the invention to the particular embodiments described. For example, in view of this disclosure, those skilled in the art can define other voltage detection circuits, low pass filters, delay line circuits, buffer circuits, dual-voltage detection circuits, dual-input low pass filters, transistors, memory test circuits, and so forth, and use these alternative features to create a method, circuit, or system according to the principles of this invention. Thus, the invention is limited only by the following claims.

What is claimed is:

1. A power-on reset circuit comprising:
   a dual-voltage detection circuit coupled to a first supply voltage terminal, a second supply voltage terminal, and a ground terminal;
   a low pass filter coupled to the dual power voltage circuit;
   a buffer circuit coupled to the low pass filter;
   a voltage detection circuit coupled to the second supply voltage terminal and the ground terminal; and
   a second low pass filter coupled to said voltage detection circuit and said buffer.

2. The power-on reset circuit of claim 1, wherein the dual-voltage detection circuit is configured to output a first voltage detection signal indicative of whether a first supply voltage on the first supply voltage terminal is greater than a first adequate voltage level and the voltage detection circuit is configured to output a second voltage detection signal indicative of whether a second supply voltage on the second supply voltage terminal is greater than a second adequate voltage level.

3. The power-on reset circuit of claim 1, further comprising a memory test circuit coupled to the buffer circuit.

4. The power-on reset circuit of claim 3, wherein the buffer circuit comprises a three-input AND gate.

5. The power-on reset circuit of claim 3, wherein the three-input AND gate comprises a three-input NAND gate and an inverter.

6. A power-on reset circuit comprising:
   a dual-voltage detection circuit;
   a dual-input low pass filter having a first input terminal coupled to the dual-voltage detection circuit, and a second input terminal; and
   a voltage detection circuit coupled to the second input terminal of the dual-input low pass filter.

7. The power-on reset circuit of claim 6, wherein the dual-input low pass filter comprises:
   a first logic gate having an input terminal coupled to the first input terminal of the dual-input low pass filter, a second input terminal coupled to the second input terminal of the dual-input low pass filter, and an output terminal;
   a delay line circuit having an input terminal coupled to the output terminal of the first logic gate, and an output terminal;
   a second logic gate having a first input terminal coupled to the first input terminal of the dual-input low pass filter, a second input terminal coupled to the output terminal of the delay line circuit, and an output terminal; and
   a third logic gate having a first input terminal coupled to the second input terminal of the dual-input low pass filter, a second input terminal coupled to the output terminal of the delay line circuit, and an output terminal.

8. The power-on reset circuit of claim 7, wherein the first logic gate is an OR gate, the second logic gate is a first NAND gate, and the third logic gate is a second NAND gate.

9. The power-on reset circuit of claim 7, wherein the first logic gate is a NAND gate, the second logic gate is a first OR gate, and the third logic gate is a second OR gate.

10. The power-on reset circuit of claim 7, further comprising a buffer circuit having a first input terminal coupled to the output terminal of the second logic gate, a second input terminal coupled to the output terminal of the third logic gate, and an output terminal.

11. The power-on reset circuit of claim 7, wherein the buffer circuit comprises an AND gate.

* * * * *